United States Patent
Imura et al.

(10) Patent No.: US 9,776,925 B2
(45) Date of Patent: Oct. 3, 2017

(54) DIELECTRIC COMPOSITION, DIELECTRIC ELEMENT, ELECTRONIC COMPONENT AND LAMINATED ELECTRONIC COMPONENT

(71) Applicant: EPCOS AG, Munich (DE)

(72) Inventors: Tomoya Imura, Tokyo (JP); Goushi Tauchi, Tokyo (JP); Masakazu Hirose, Tokyo (JP)

(73) Assignee: EPCOS AG, Munich (DE)

(*) Notice: Subject to any disclaimer, the term of this patent is extended or adjusted under 35 U.S.C. 154(b) by 0 days.

(21) Appl. No.: 15/113,425

(22) PCT Filed: Jan. 21, 2015

(86) PCT No.: PCT/EP2015/051126
§ 371 (c)(1),
(2) Date: Jul. 21, 2016

(87) PCT Pub. No.: WO2015/110464
PCT Pub. Date: Jul. 30, 2015

(65) Prior Publication Data
US 2017/0029337 A1    Feb. 2, 2017

(30) Foreign Application Priority Data
Jan. 21, 2014  (JP) .............................. 2014-008865

(51) Int. Cl.
C04B 35/475    (2006.01)
H01G 4/12    (2006.01)
(Continued)

(52) U.S. Cl.
CPC .......... C04B 35/475 (2013.01); C04B 35/462 (2013.01); C04B 35/47 (2013.01);
(Continued)

(58) Field of Classification Search
CPC ...... C04B 35/47; C04B 35/475; H01G 4/1218
See application file for complete search history.

(56) References Cited

U.S. PATENT DOCUMENTS 8,076,257 B1    12/2011 Wilson
8,529,785 B2 *   9/2013 Kubota ............... C04B 35/2658
                                                    252/62.9 PZ
(Continued)

FOREIGN PATENT DOCUMENTS

CN    101305480 A    11/2008
CN    102189800 A    9/2011
(Continued)

OTHER PUBLICATIONS

Parija B. et al., "Structure, microstructure and dielectric properties of 100-(BiNa) TiO-(SrTiO) composites ceramics", Applied Physics A; Materials Science & Processing, Aug. 25, 2012, vol. 109, No. 3, pp. 715-723.
(Continued)

*Primary Examiner* — Karl Group
(74) *Attorney, Agent, or Firm* — McDermott Will & Emery LLP

(57) ABSTRACT

[Problem] The problem addressed lies in providing a dielectric composition having a relatively high dielectric constant of 900 or greater when a DC bias of at least 8 V/ym is applied, and also in providing a dielectric element employing said dielectric composition, an electronic component, and a laminated electronic component. [Solution] A dielectric composition in which the composition of the main component is in accordance with the following formula (1): $(Bi_aNa_bSr_c)(Zn_dTi_{1-d})O_3$ (1) [where a, b, c and d satisfy the following: $0.09 \le a \le 0.58$, $0.09 \le b \le 0.42$, $0.05 \le c \le 0.84$, $0 \le d \le 0.08$, and $0.95 \le a+b+c \le 1.05$].

5 Claims, 2 Drawing Sheets

(51) Int. Cl.
*C04B 35/462* (2006.01)
*C04B 35/47* (2006.01)
*H01L 41/187* (2006.01)
*H01G 4/005* (2006.01)
*H01G 4/30* (2006.01)

(52) U.S. Cl.
CPC .......... *H01G 4/005* (2013.01); *H01G 4/1218* (2013.01); *H01G 4/30* (2013.01); *H01L 41/187* (2013.01); *C04B 2235/3201* (2013.01); *C04B 2235/3213* (2013.01); *C04B 2235/3236* (2013.01); *C04B 2235/3284* (2013.01); *C04B 2235/3298* (2013.01); *C04B 2235/768* (2013.01); *C04B 2235/77* (2013.01); *C04B 2235/79* (2013.01)

(56) References Cited

U.S. PATENT DOCUMENTS

| | | | |
|---|---|---|---|
| 8,734,670 B2* | 5/2014 | Jeon | .................. C04B 35/475 252/62.9 PZ |
| 2010/0025617 A1* | 2/2010 | Kubota | ............... C04B 35/2658 252/62.9 PZ |
| 2011/0221827 A1 | 9/2011 | Sakai et al. | |
| 2013/0161556 A1* | 6/2013 | Jeon | ................... H01L 41/1878 252/62.9 PZ |
| 2013/0330541 A1* | 12/2013 | Kubota | ............... C04B 35/2658 428/336 |
| 2017/0032893 A1* | 2/2017 | Tauchi | ................. C04B 35/462 |

FOREIGN PATENT DOCUMENTS

| | | |
|---|---|---|
| CN | 102471166 A | 5/2012 |
| CN | 103119742 A | 5/2013 |
| JP | 03-158553 B2 | 4/2001 |
| JP | 3334607 B2 | 10/2002 |
| JP | 2005-047748 A | 2/2005 |
| JP | 2015107905 A | 6/2015 |
| WO | 2006/060191 A2 | 6/2006 |
| WO | 2011/012682 A1 | 2/2011 |
| WO | 2012/044309 A1 | 4/2012 |
| WO | 2012/044313 A1 | 4/2012 |

OTHER PUBLICATIONS

Seung-Eek Park S. et al., "Variations of structure and dielectric properties on substituting A-site cations for Sr2+ in (Na1/2Bi1/2)TiO3", Journal of Materials Research, Aug. 1, 1997, pp. 2152-2157, XP055176745, URL:http://journals.cambridge.org/action/displayFulltext?type=1&fid=7981663&jid=JMR&volumeld=12&issueld=08&aid=7981661.

Wang L. et al., "Dielectric and Piezoelectric Properties of lead-free BaTiO3-Bi(Zn0.5Ti0.5)o3 and (Bi0,5Na0,5)TiO3—Bi(Zn0,5Ti0,5)O3Ceramics", Ferroelectrics, Jan. 1, 2009, vol. 380, pp. 177-182.

Ying-Chieh Lee Y. et al., "Piezoelectric properties and microstructures of ZnOdoped BiNaTiO ceramics", Journal of European ceramic society, vol. 31, No. 16, pp. 3145-3152.

\* cited by examiner

DIELECTRIC COMPOSITION, DIELECTRIC ELEMENT, ELECTRONIC COMPONENT AND LAMINATED ELECTRONIC COMPONENT

TECHNICAL FIELD

The present invention relates to a dielectric composition and a dielectric element employing same, and to an electronic component and a laminated electronic component; more specifically, the present invention relates to a dielectric composition and a dielectric element which are advantageously used for medium- and high-voltage applications with a relatively high rated voltage.

PRIOR ART

In recent years there has been a great demand for miniaturization of dielectric elements as electronic circuits reach higher densities, and miniaturization of electronic components such as laminated ceramic capacitors together with increased capacity are rapidly progressing, while the applications thereof are also expanding. Various characteristics are required as this takes place.

For example, medium- and high-voltage capacitors which are used in devices such as ECMs (engine electronic computer modules), fuel injection devices, electronic control throttles, inverters, converters, HID headlamp units, hybrid engine battery control units and digital still cameras have a rated voltage in excess of 100 V. Medium- and high-voltage capacitors such as these need a high dielectric constant and high capacitance when a high DC bias is applied.

However, conventional dielectric compositions are designed on the assumption that they will be used when a low DC bias of the order of 1 V/μm is applied, for example. This means that if an electronic component having a dielectric layer comprising a conventional dielectric composition is used when a high DC bias is applied, there is a problem in that the dielectric constant and capacitance are reduced. This problem becomes more marked the higher the DC bias, especially in laminated ceramic capacitors which have very thin layers, because the dielectric constant and the capacitance tend to decrease.

In order to solve the abovementioned problem, Patent Document 1 mentioned below describes a dielectric composition which contains a main component comprising: barium titanate having an alkali metal oxide content of 0.02 wt % or less; at least one compound selected from among europium oxide, gadolinium oxide, terbium oxide, dysprosium oxide, holmium oxide, erbium oxide, thulium oxide, and ytterbium oxide; barium zirconate, magnesium oxide and manganese oxide, said main component being represented by the following compositional formula: $\{BaO\}_m TiO_2 + \alpha R_2O_3 + \beta BaZrO_3 + \gamma MgO + gMnO$ (where $R_2O_3$ is at least one compound selected from among $Eu_2O_3$, $Gd_2O_3$, $Tb_2O_3$, $Dy_2O_3$, $Ho_2O_3$, $Er_2O_3$, $Tm_2O_3$ and $Yb_2O_3$; and $\alpha$, $\beta$, $\gamma$, and g represent a mole ratio and are within the following ranges: $0.001 \leq \alpha \leq 0.06$, $0.005 \leq \beta \leq 0.06$, $0.001 < \gamma \leq 0.12$, $0.001 < g \leq 0.12$, $\gamma + g \leq 0.13$, and $1.000 < m \leq 1.035$); and said dielectric composition contains, as an auxiliary component, silicon oxide in an amount of 0.2-5.0 mol as $SiO_2$ equivalent, with respect to 100 mol of the main component.

However, although a dielectric composition such as that described in Patent Document 1 has a relatively large dielectric constant when a DC bias of 5 V/μm is applied, a dielectric composition having a high dielectric constant under an even higher DC bias voltage would be desirable in order to cope with the thinner layers accompanying the miniaturization and higher capacity of medium- and high-voltage capacitors.

PRIOR ART DOCUMENTS

Patent Documents

[Patent Document 1] JP 3334607 B2

SUMMARY OF THE INVENTION

Problem to be Solved by the Invention

In view of the situation outlined above, the aim of the present invention lies in providing a dielectric composition which is advantageously used for medium- and high-voltage applications with a relatively high rated voltage, and which has a relatively high dielectric constant of 900 or greater when a DC bias of at least 8 V/μm is applied, and also in providing a dielectric element employing said dielectric composition, an electronic component, and a laminated electronic component.

Moreover, according to the present invention, a direct current electric field which is applied to the dielectric composition, dielectric element, electronic component and laminated electronic component is referred to as a DC (direct current) bias. Furthermore, the characteristic of the dielectric constant and capacitance of the dielectric composition etc. varying as a result of a DC bias being applied is referred to as the DC bias characteristics.

Means for Solving the Problem

In order to achieve the abovementioned aim, the dielectric composition according to the present invention has a main component composition in accordance with the following formula (1):

$$(Bi_a Na_b Sr_c)(Zn_d Ti_{1-d})O_3 \qquad (1)$$

characterized in that a, b, c and d satisfy the following: $0.09 \leq a \leq 0.58$, $0.09 \leq b \leq 0.42$, $0.05 \leq c \leq 0.84$, $0 < d \leq 0.08$, and $0.95 \leq a+b+c \leq 1.05$.

It should be noted that a, b, c and d represent the number of atoms of Bi, Na, Sr and Zn when there are three oxygen atoms.

This dielectric composition according to the present invention has the abovementioned constitution, and as a result it is possible to achieve a relatively high dielectric constant of 900 or greater when a DC bias of at least 8 V/μm is applied.

Preferably, a, b, c and d satisfy the following: $0.27 \leq a \leq 0.48$, $0.18 \leq b \leq 0.38$, $0.20 \leq c \leq 0.60$, $0.02 \leq d \leq 0.05$, and $0.95 \leq a+b+c \leq 1.05$.

A dielectric element according to the present invention comprises the abovementioned dielectric composition.

An electronic component according to the present invention is provided with a dielectric layer comprising the abovementioned dielectric composition.

A laminated electronic component according to the present invention has a laminated portion formed by alternately laminating an internal electrode layer and a dielectric layer comprising the abovementioned dielectric composition.

Advantage of the Invention

The inventive dielectric element, electronic component and laminated electronic component are advantageously used in a medium- and high-voltage capacitor with a relatively high rated voltage. The present invention makes it possible to provide a dielectric composition having a relatively high dielectric constant of 900 or greater when a DC bias of at least 8 V/μm is applied, and also in providing a dielectric element employing said dielectric composition, an electronic component, and a laminated electronic component.

There is no particular limitation as to the applications of the dielectric element comprising the abovementioned dielectric composition, electronic component and laminated electronic component, but they are useful in a circuit protection snubber capacitor or smoothing capacitor in which a high dielectric constant is required when a high DC bias is applied.

In addition, the dielectric composition according to the present invention has excellent characteristics without containing lead. As a result, the inventive dielectric composition, dielectric element, electronic component and laminated electronic component are outstanding from an environmental point of view.

MODE OF EMBODIMENT OF THE INVENTION

A preferred mode of embodiment of the present invention will be described below, in some cases with reference to the figures. It should be noted that in the figures, the same reference symbols are used for elements which are the same or equivalent and a duplicate description will not be given.

Figure 1:
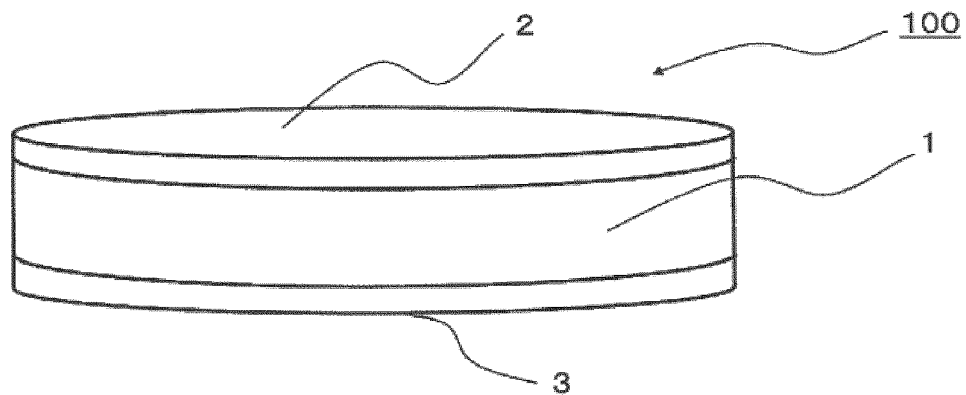
FIG. 1 is a schematic diagram of a ceramic capacitor according to a mode embodiment of the present invention.

As shown in FIG. 1, a single-layer ceramic capacitor 100 according to a mode of embodiment of the present invention comprises a disk-shaped dielectric body 1 and a pair of electrodes 2, 3. The single-layer ceramic capacitor 100 is obtained by forming the electrodes 2, 3 on both surfaces of the dielectric body 1. There is no particular limitation as to the shapes of the dielectric body 1 and the electrodes 2, 3. Furthermore, there is no particular limitation as to the dimensions thereof either, and suitable dimensions should be set in accordance with the application.

The dielectric body 1 is formed by a dielectric composition represented by the following formula (1).

$$(Bi_aNa_bSr_c)(Zn_dTi_{1-d})O_3 \qquad (1)$$

In formula (1), a, b, c and d satisfy the following: $0.09 \leq a \leq 0.58$, $0.09 \leq b \leq 0.42$, $0.05 \leq c \leq 0.84$, $0 < d \leq 0.08$, and $0.95 \leq a+b+c \leq 1.05$.

This kind of dielectric composition has the abovementioned constitution, and as a result it is possible to achieve a relatively high dielectric constant of 900 or greater when a DC bias of 8 V/μm is applied.

Here, $0.09 \leq a \leq 0.58$ because if a is less than 0.09, the dielectric constant decreases, while if a is greater than 0.58, the withstand voltage decreases. a is preferably such that $0.27 \leq a \leq 0.48$ from the point of view of increasing the dielectric constant.

Furthermore, $0.09 \leq b \leq 0.42$ because if b is less than 0.09, the dielectric constant decreases, while if b is greater than 0.42, the withstand voltage decreases. b is preferably such that $0.18 \leq b \leq 0.38$ from the point of view of increasing the dielectric constant.

Furthermore, $0.05 \leq c \leq 0.84$ because if c is less than 0.05 or greater than 0.84, the dielectric constant decreases. c is preferably such that $0.20 \leq c \leq 0.60$ from the point of view of increasing the dielectric constant.

Furthermore, $0 < d \leq 0.08$ because if d is 0, the withstand voltage decreases, and if d is greater than 0.08, the dielectric constant decreases. d is preferably such that $0.02 \leq d \leq 0.05$ from the point of view of increasing the dielectric constant.

In addition, if a+b+c is less than 0.95 or greater than 1.05, it is not possible to obtain an adequate sintered density and the insulation resistance is reduced, so it is difficult to use the dielectric composition when a high DC bias is applied.

The dielectric according to this mode of embodiment is a combination of ferroelectric compositions, and by providing this specific combination, it is possible to achieve a relatively high dielectric constant of 900 or greater when a DC bias of 8 V/μm is applied.

The content of the main component represented by formula (1) is preferably at least 90 mass % based on the dielectric composition as a whole, from the point of view of obtaining a dielectric constant which is sufficient for practical use as a dielectric composition. Furthermore, the dielectric composition may contain one or more oxides of elements selected from: Mg, Mn, Co, Ni, Al and Si, as auxiliary components in addition to the main component. In addition, the dielectric composition may include impurities such as P and Zr and different crystal phases which may become mixed in during the production process.

The constitution of the dielectric composition may be measured by X-ray fluorescence analysis or by ICP atomic emission spectroscopy.

The relative density of the abovementioned dielectric composition is preferably 95% or greater when the theoretical density is 100%. In this case, in the present specification, the relative density refers to the proportion of the actual measured value of the density with respect to the theoretical density. It should be noted that the theoretical density of the dielectric composition may be calculated using the lattice constant obtained by means of X-ray diffraction and the stoichiometric ratio obtained on the basis of perfect crystals, for example. The actual measured value of the density of the dielectric composition may be obtained by means of the Archimedes method, for example. The relative density of the dielectric composition may be adjusted by varying the firing temperature or firing time etc.

An example of a method for producing the ceramic capacitor shown in FIG. 1 will be described below.

First of all, powders of bismuth oxide ($Bi_2O_3$), sodium carbonate ($Na_2CO_3$), strontium carbonate ($SrCO_3$), zinc oxide (ZnO) and titanium oxide ($TiO_2$) etc. are prepared as the starting materials of the dielectric body 1.

The abovementioned powder starting materials are then weighed out in such a way that the dielectric composition which has been fired (sintered compact) satisfies the composition of the dielectric composition according to this mode of embodiment.

The weighed starting material powders are then wet-mixed using a ball mill or the like. A calcined article is obtained by calcining the mixture obtained by wet-mixing.

At this point, the calcination is normally carried out under air. Furthermore, the calcination temperature is preferably 700-900° C. and the calcination time is preferably 1-10 hours.

The resulting calcined article is wet-ground in a ball mill or the like, after which it is dried to obtain calcined powder. A binder is then added to the resulting calcined powder and press molding is performed to obtain a molded article. There is no particular limitation as to the binder which may be used provided that it is a binder which is conventionally employed in this technical field. Specific examples of binders which may be cited include polyvinyl alcohol and polyvinyl butyral. There is no particular limitation as to the amount of binder which is added, but an amount of 1-5 wt % is preferably added when the calcined powder is taken as 100 wt %. In addition, the molding pressure is preferably of the order of $5 \times 10^2$ MPa. There is no particular limitation as to the shape of the molded article. According to this mode of embodiment, a disk shape is formed, but a cuboid shape or another shape may equally be formed.

The dielectric body 1 is obtained by firing the resulting molded article. Here, the firing is normally carried out under air. Furthermore, the firing temperature is preferably 900-1300° C., and the firing time is preferably 2-10 hours.

The electrodes 2, 3 are then formed on both surfaces of the resulting dielectric body 1. There is no particular limitation as to the material of the electrodes, and Ag, Au, Cu, Pt, Ni or the like is used. The electrodes are formed by means of a method such as vapor deposition, sputtering, printing or electroless plating, but other methods may also be used and there is no particular limitation as to the method of forming the electrodes.

Figure 2:
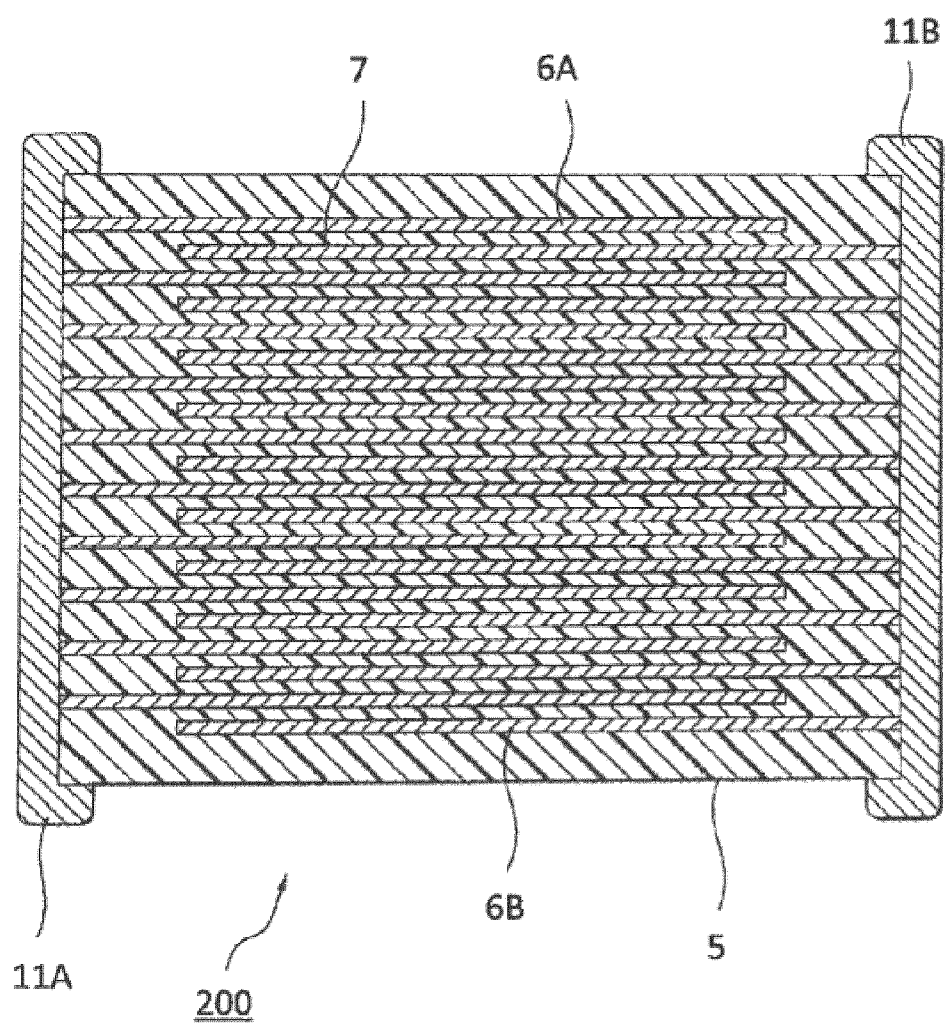
FIG. 2 is a view in cross section of a laminated ceramic capacitor according to a different mode of embodiment of the present invention.

FIG. 2 is a view in cross section of a laminated ceramic capacitor according to a different mode of embodiment of the present invention. As shown in FIG. 2, a laminated ceramic capacitor 200 according to a mode of embodiment of the present invention comprises a capacitor element main body 5 having a structure in which dielectric layers 7 and internal electrode layers 6A, 6B are alternately stacked. A pair of terminal electrodes 11A, 11B which conduct, respectively, with the internal electrode layers 6A, 6B alternately arranged inside the element main body 5 are formed at both ends of the element main body 5. There is no particular limitation as to the shape of the element main body 5, but it is normally a cuboid shape. Furthermore, there is no particular limitation as to the dimensions thereof, and suitable dimensions should be set in accordance with the application.

The dielectric layers 7 comprise the dielectric composition according to the present invention.

The thickness per layer of the dielectric layers 7 may be freely set and may be 1-100 μm, for example, but there is no particular limitation.

The internal electrode layers 6A, 6B are provided in such a way as to be parallel. The internal electrode layers 6A are formed in such a way that one end thereof is exposed at the end surface of the laminated body 5 where the terminal electrode 11A is formed. Furthermore, the internal electrode layers 6B are formed in such a way that one end thereof is exposed at the end surface of the laminated body 5 where the terminal electrode 11B is formed. In addition, the internal electrode layers 6A and internal electrode layers 6B are disposed in such a way that the majority thereof is overlapping in the direction of stacking.

A metal such as Au, Pt or Ag may be used as the material of the internal electrode layers 6A, 6B, for example, but there is no particular limitation and other metals may also be used.

The terminal electrodes 11A, 11B are provided at the end surfaces of the laminated body 5 in contact with the ends of the internal electrode layers 6A, 6B which are exposed at said end surfaces. As a result, the terminal electrodes 11A, 11B are electrically connected to the internal electrode layers 6A, 6B, respectively. The terminal electrode 11A, 11B may comprise a conductive material having Ag, Au, Cu or the like as the main component thereof. The thickness of the terminal electrodes 11A, 11B is appropriately set in accordance with the application and the size of the laminated dielectric element, among other things. The thickness may be set at 10-50 μm, but there is no particular limitation.

A single-layer ceramic capacitor and a laminated ceramic capacitor in accordance with modes of embodiment of the present invention were described above. The dielectric composition according to the present invention has a high dielectric constant and capacitance when a high DC bias is applied, and it can therefore be advantageously used for medium- and high-voltage capacitors with a relatively high rated voltage, for example.

Furthermore, the present invention is not limited to the modes of embodiment described above. For example, the dielectric layers comprising the dielectric composition according to the present invention may also be used as a dielectric elements in a semiconductor device etc. Furthermore, a known configuration may be freely used in the present invention, other than the dielectric composition. Furthermore, the calcined powder may be produced by means of a known method such as hydrothermal synthesis when the ceramic capacitor is produced. Furthermore, $Bi(Zn_{0.5}Ti_{0.5})O_3$, $(Bi_{0.5}Na_{0.5})TiO_3$ and $SrTiO_3$ etc. may also be prepared, mixed and sintered as precursors.

The dielectric according to this mode of embodiment is a combination of ferroelectric compositions, and by providing this specific combination, it is possible to achieve a relatively high dielectric constant of 900 or greater when a DC bias of 8 V/μm is applied.

The dielectric composition according to the present invention may also be referred to as a combination of ferroelectric compositions such as Bi $(Zn_{0.5}Ti_{0.5})O_3$, $(Bi_{0.5}Na_{0.5})TiO_3$ and $SrTiO_3$, for example. It is believed to be possible to provide a relatively high dielectric constant of 900 or greater when a DC bias of at least 8 V/μm is applied by virtue of this specific combination of ferroelectric compositions.

[Exemplary Embodiments]

The present invention will be described below in further detail with the aid of exemplary embodiments and comparative examples. However, the present invention is not limited to the following exemplary embodiments.

(Exemplary Embodiments 1-16 ) and Comparative Examples 1-10)

In order to produce the dielectric composition, powders of bismuth oxide ($Bi_2O_3$), sodium carbonate ($Na_2CO_3$), strontium carbonate ($SrCO_3$), zinc oxide (ZnO) and titanium oxide ($TiO_2$) were prepared as starting materials.

The abovementioned powder starting materials were then weighed out in such a way that the dielectric composition which had been fired (sintered compact) satisfied the compositions shown in table 1. It should be noted here that a, b, c and d in table 1 represent numerical values of a, b, c and d, respectively, in the following formula (1).

$$(Bi_a Na_b Sr_c)(Zn_d Ti_{1-d})O_3 \tag{1}$$

The weighed starting material powders were then wet-mixed using a ball mill, after which the resulting mixture was calcined for 2 hours at 850° C. under air in order to obtain a calcined article. The resulting calcined article was wet-ground in a ball mill to obtain calcined powder. 1 wt % of polyvinyl alcohol was then added to the calcined powder, taking the calcined powder as 100 wt %, molding was carried out at a pressure of about 5×10² MPa, and a disk-shaped molded article having plane dimensions of the order of diameter 17 mm and thickness 1 mm was obtained.

The resulting molded article was then fired under the air at a firing temperature of 900-1300° C. and a firing time of 2-10 hours under conditions such that the relative density was 95% or greater, in order to obtain dielectric composition samples. When the density of the resulting dielectric samples was measured, the density of all the samples was 95% or greater with respect to the theoretical density.

The compositions of the resulting dielectric composition samples were analyzed by means of X-ray fluorescence analysis. As a result, it was confirmed that the compositions of the sintered compacts were equivalent to the compositions in table 1.

Ag electrodes were vapor-deposited on both surfaces of the resulting dielectric composition samples in order to produce capacitor samples.

The dielectric constant ($\in$) at room temperature of 25° C. when a DC bias of 8 V/µm was applied was measured for each of the resulting capacitor samples.

A DC-voltage power source (Glassman High Voltage, WX10P90) was connected to a digital LCR meter (Hewlett-Packard, 4284A), and the dielectric constant was measured by said digital LCR meter at room temperature of 25° C. while a DC bias of 8 V/µm was applied.

The dielectric constant when a DC bias of 8 V/µm was applied at room temperature of 25° C. is shown in table 1 for each exemplary embodiment and comparative example. Furthermore, the bar lines in the table indicate that breakdown occurred when a DC bias of 8 V/µm was applied and the dielectric constant could not be measured. The examples in which the dielectric constant was 900 or greater when a DC bias of 8 V/µm was applied were deemed to be satisfactory.

TABLE 1

| | Composition | | | | | Dielectric |
| --- | --- | --- | --- | --- | --- | --- |
| | a | b | c | d | a + b + c | constant $\in$ |
| Exemplary Embodiment 1 | 0.28 | 0.23 | 0.50 | 0.03 | 1.01 | 1680 |
| Exemplary Embodiment 2 | 0.30 | 0.20 | 0.50 | 0.05 | 1.00 | 1755 |
| Exemplary Embodiment 3 | 0.33 | 0.18 | 0.50 | 0.08 | 1.01 | 1540 |
| Exemplary Embodiment 4 | 0.38 | 0.23 | 0.40 | 0.08 | 1.01 | 1320 |
| Exemplary Embodiment 5 | 0.38 | 0.33 | 0.30 | 0.03 | 1.01 | 1605 |
| Exemplary Embodiment 6 | 0.40 | 0.30 | 0.30 | 0.05 | 1.00 | 1300 |
| Exemplary Embodiment 7 | 0.43 | 0.28 | 0.30 | 0.08 | 1.01 | 1160 |
| Exemplary Embodiment 8 | 0.43 | 0.38 | 0.20 | 0.03 | 1.01 | 1195 |
| Exemplary Embodiment 9 | 0.45 | 0.35 | 0.20 | 0.05 | 1.00 | 1130 |
| Exemplary Embodiment 10 | 0.48 | 0.33 | 0.20 | 0.08 | 1.01 | 900 |
| Exemplary Embodiment 11 | 0.22 | 0.09 | 0.64 | 0.05 | 0.95 | 905 |
| Exemplary Embodiment 12 | 0.58 | 0.42 | 0.05 | 0.08 | 1.05 | 920 |
| Exemplary Embodiment 13 | 0.09 | 0.11 | 0.80 | 0.01 | 1.00 | 910 |
| Exemplary Embodiment 14 | 0.30 | 0.25 | 0.50 | 0.03 | 1.05 | 1705 |
| Exemplary Embodiment 15 | 0.10 | 0.10 | 0.84 | 0.01 | 1.04 | 910 |
| Exemplary Embodiment 16 | 0.27 | 0.18 | 0.60 | 0.02 | 1.05 | 1620 |
| Comparative Example 1 | 0.08 | 0.08 | 0.84 | 0.00 | 1.00 | 860 |
| Comparative Example 2 | 0.38 | 0.38 | 0.19 | 0.00 | 0.95 | — |
| Comparative Example 3 | 0.10 | 0.10 | 0.80 | 0.00 | 1.00 | 880 |
| Comparative Example 4 | 0.46 | 0.46 | 0.04 | 0.08 | 0.96 | 800 |
| Comparative Example 5 | 0.40 | 0.40 | 0.20 | 0.09 | 1.00 | 820 |
| Comparative Example 6 | 0.27 | 0.27 | 0.52 | 0.03 | 1.06 | — |
| Comparative Example 7 | 0.18 | 0.18 | 0.59 | 0.05 | 0.94 | 840 |
| Comparative Example 8 | 0.59 | 0.08 | 0.30 | 0.03 | 0.97 | — |
| Comparative Example 9 | 0.20 | 0.43 | 0.40 | 0.03 | 1.03 | — |
| Comparative Example 10 | 0.07 | 0.07 | 0.85 | 0.03 | 0.99 | 820 |

It can be seen from the above that the dielectric compositions according to Exemplary Embodiments 1-16 in which a, b, c and d satisfied $0.09 \leq a \leq 0.58$, $0.09 \leq b \leq 0.42$, $0.05 \leq c \leq 0.84$, $0 < d \leq 0.08$, and $0.95 \leq a+b+c \leq 1.05$ had a dielectric constant of 900 or greater when a DC bias of 8 V/µm was applied, and these compositions were in a preferred range.

In contrast to this, the dielectric compositions according to Comparative Examples 1-10 which did not satisfy at least one from among $0.09 \leq a \leq 0.58$, $0.09 \leq b \leq 0.42$, $0.05 \leq c \leq 0.84$, $0 < d \leq 0.08$, and $0.95 \leq a+b+c \leq 1.05$ had a dielectric constant of less than 900 when a DC bias of 8 V/µm was applied, or it was not possible to measure the dielectric constant.

In addition, a DC bias applied in the range of 0-8 V/µm was varied for the capacitor sample according to Exemplary Embodiment 3 and the dielectric constant was measured. The measurement result is shown in FIG. 3 together with an outline of the change in dielectric constant of a conventional $BaTiO_3$-based capacitor sample.

Figure 3:
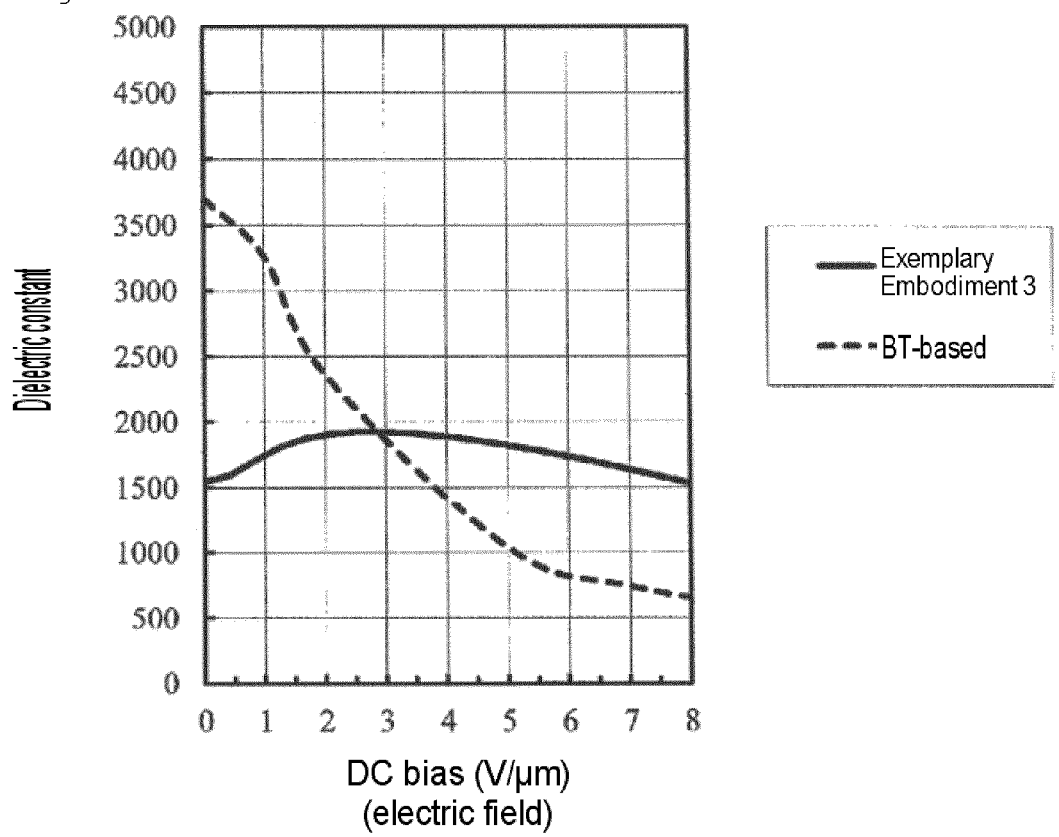
FIG. 3 is a graph schematically showing both a DC bias characteristics graph in accordance with an exemplary embodiment of the present invention, and a DC bias characteristics graph of a conventional $BaTiO_3$-based dielectric composition.

It is clear from FIG. 3 that the dielectric constant sharply dropped as the DC bias applied increased in the case of the conventional $BaTiO_3$-based capacitor sample, whereas the dielectric constant when a DC bias of 2-4 V/µm was applied was a maximum in the case of the capacitor sample having the dielectric composition according to the present invention, and even when the DC bias increased, a high dielectric constant was maintained.

KEY TO SYMBOLS

1 Dielectric body
2, 3 Electrode
5 Laminated body
6A, 6B Internal electrode layer
7 Dielectric layer
11A, 11B Terminal electrode
100 Ceramic capacitor
200 Laminated ceramic capacitor

The invention claimed is:

1. A dielectric composition in which the composition of the main component is in accordance with the following formula (1):

$$(Bi_aNa_bSr_c)(Zn_dTi_{1-d})O_3 \quad (1)$$

characterized in that a, b, c and d satisfy the following: $0.09 \leq a \leq 0.58$, $0.09 \leq b \leq 0.42$, $0.05 \leq c \leq 0.84$, $0 \leq d \leq 0.08$, and $0.95 \leq a+b+c \leq 1.05$.

2. The dielectric composition as claimed in claim 1, wherein a, b, c and d satisfy the following: $0.27 \leq a \leq 0.48$, $0.18 \leq b \leq 0.38$, $0.20 \leq c \leq 0.60$, $0.02 \leq d \leq 0.05$, and $0.95 \leq a+b+c \leq 1.05$.

3. A dielectric element comprising the dielectric composition as claimed in claim 1.

4. An electronic component provided with a dielectric layer comprising the dielectric composition as claimed in claim 1.

5. A laminated electronic component having a laminated portion formed by alternately laminating an internal electrode layer and a dielectric layer comprising the dielectric composition as claimed in claim 1.

* * * * *

UNITED STATES PATENT AND TRADEMARK OFFICE
CERTIFICATE OF CORRECTION

PATENT NO. : 9,776,925 B2
APPLICATION NO. : 15/113425
DATED : October 3, 2017
INVENTOR(S) : Tomoya Imura et al.

It is certified that error appears in the above-identified patent and that said Letters Patent is hereby corrected as shown below:

In the Claims

In Column 9, Line 7, Claim 1:
Replace "$0 \leq d \leq 0.08$", with --$0 < d \leq 0.08$--.

Signed and Sealed this
Twentieth Day of February, 2018

Andrei Iancu
*Director of the United States Patent and Trademark Office*